(12) United States Patent  
Yamamoto

(10) Patent No.: US 7,749,017 B2  
(45) Date of Patent: Jul. 6, 2010

(54) HIGH FREQUENCY UNIT WITH IMPROVED MOUNTING PLATE

(75) Inventor: Masaki Yamamoto, Miyagi-Ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 12/472,658

(22) Filed: May 27, 2009

(65) Prior Publication Data

US 2009/0298329 A1 Dec. 3, 2009

(30) Foreign Application Priority Data

May 30, 2008 (JP) .............................. 2008-142782

(51) Int. Cl.
*H01R 13/73* (2006.01)
*H02B 1/01* (2006.01)

(52) U.S. Cl. ..................... 439/527; 439/63; 361/818

(58) Field of Classification Search ................. 439/527, 439/63, 607.28, 607.35; 334/85; 361/818, 361/816
See application file for complete search history.

(56) References Cited

U.S. PATENT DOCUMENTS

| | | | | |
|---|---|---|---|---|
| 4,404,617 A | * | 9/1983 | Ohyama et al. ............. | 361/818 |
| 4,697,044 A | * | 9/1987 | Ishikawa .................... | 174/372 |
| 6,118,672 A | * | 9/2000 | Yamauchi et al. .......... | 361/818 |
| 6,731,518 B2 | * | 5/2004 | Suzuki et al. ............... | 361/818 |
| 7,207,106 B2 | * | 4/2007 | Abe et al. ................... | 29/842 |
| 2002/0135445 A1 | | 9/2002 | Onishi | |

FOREIGN PATENT DOCUMENTS

JP 4020743 10/2007

* cited by examiner

*Primary Examiner*—Hae Moon Hyeon
(74) *Attorney, Agent, or Firm*—Brinks Hofer Gilson & Lione

(57) ABSTRACT

Provided is a high frequency unit for suppressing deformation of a mounting plate which needs to be concerned when attaching or detaching an external connector, at low cost and high reliability of a connection between a core of a coaxial connector and a circuit board. The high frequency unit includes: a circuit board on which a high frequency circuit unit is formed, a shield case having a frame shape enclosing the circuit board with a plurality of side walls; a partition wall for partitioning a space on the circuit board; a mounting plate which is made of a rectangular metal sheet disposed to face the circuit board and of which three peripheral portions of an outer edge are supported by the two side walls and the partition wall; a coaxial connector fixed to the mounting plate; and a sheet metal cover covering an upper open end of the shield case.

8 Claims, 2 Drawing Sheets

HIGH FREQUENCY UNIT WITH IMPROVED MOUNTING PLATE

CROSS REFERENCE TO RELATED APPLICATIONS

The present invention contains subject matter related to and claims priority to Japanese Patent Application No. 2008-142782 filed in the Japanese Patent Office on May 30, 2008, the entire contents of which is incorporated herein by reference.

BACKGROUND

1. Technical Field

The present disclosure relates to a high frequency unit in which a coaxial connector is fixed to a mounting plate that is supported by side walls of a shield case enclosing a circuit board to face the circuit board, and the coaxial connector being attached to or detached from an external connector.

2. Related Art

In this type of high frequency unit, an outer edge of a mounting plate extending from side walls of a shield case along a circuit board is supported by the side walls or a partition wall, so that a coaxial connector fixed to the mounting plate is stably supported. The partition wall is a metal plate partitioning a space on the circuit board and fixed to the side walls of the shield case. In addition, a high frequency circuit unit such as a tuner circuit is formed on the circuit board, and a core extending from the coaxial connector toward the circuit board is soldered to a connection land of the high frequency circuit unit (for example, refer to Japanese Patent No. 4020743).

In a technique disclosed in Japanese Patent No. 4020743, the entire outer edge (four sides) of the rectangular mounting plate is supported by the three side walls of the shield case and the partition wall. In this case, a longitudinal dimension of the mounting plate is the same as a longitudinal dimension of a longer side of the side wall of the shield case, so that the area of the mounting plate is large.

Also, a high frequency unit having a configuration in which a coaxial connector is fixed to a mounting plate with a relatively smaller area has been widely used. In this configuration, an outer edge of the mounting plate is supported by one or two adjacent side walls of a shield case and a partition wall, and thus the mounting plate has a narrow width that is slightly greater than an outer diameter of the coaxial connector.

In addition, an open end of the shield case at which the mounting plate is disposed is generally covered by a sheet metal cover provided with a through-hole through which a coaxial connector penetrates. The sheet metal cover covers the shield case while overlapping with the mounting plate and is fitted to the side walls of the shield case.

However, in this type of high frequency unit, when an external connector is attached to or detached from the coaxial connector fixed to the mounting plate, a relatively high bending stress is exerted on the mounting plate. In the technique disclosed in Japanese Patent No. 4020743, the entire periphery of the outer edge of the rectangular mounting plate is supported by the side walls of the shield case and the partition wall, so that there is a small possibility that the mounting plate is significantly deformed when attached to or detached from the external connector. However, due to the large area of the mounting plate, a little deformation thereof cannot be avoided. In addition, when the mounting plate is deformed when attached to or detached from the external connector, an external force causing a core of the coaxial connector to push or pull the circuit board occurs, and there was a concern that a junction of the core and the circuit board may be broken down.

In addition, in the case of the existing high frequency unit in which the outer edge of the mounting plate is supported by one or two adjacent side walls of the shield case and the partition wall, peripheral portions that are easily deformed exist at the outer edge of the mounting plate. Therefore, there was a concern that, when attaching or detaching the external connector, the mounting plate is deformed and the junction of the core of the coaxial connector and the circuit board may be broken down.

It is desirable to provide a high frequency unit capable of suppressing deformation of a mounting plate which needs to be concerned when attaching or detaching an external connector, at low cost and high reliability of a connection between a core of a coaxial connector and a circuit board.

SUMMARY

According to an aspect of the invention, there is provided a high frequency unit including: a shield case having a frame shape enclosing a circuit board with a plurality of side walls; a partition wall that partitions a space on the circuit board; a mounting plate made of a metal sheet supported by the partition wall and the side walls of the shield case; and a coaxial connector fixed to the mounting plate to protrude outward, wherein a core extending from the coaxial connector toward the circuit board is connected to a high frequency circuit unit of the circuit board, and a side plate extends from a peripheral portion, which is not supported by the side walls and the partition wall, of an outer edge of the mounting plate, to be bent toward the circuit board.

In the high frequency unit having the above-mentioned configuration, the side plate extending from the peripheral portion, which is not supported by the side walls of the shield case and the partition wall, of the outer edge of the mounting plate, functions as a reinforcing rib, so that the coaxial connector can be fixed to the mounting plate which has a relatively smaller area and is hardly deformed. Accordingly, at low cost, it is possible to effectively suppress deformation of the mounting plate which needs to be concerned when attaching or detaching an external connector, and reliability of a connection between the core of the coaxial connector and the circuit board can be increased. Moreover, due to the side plate provided to the mounting plate, the core of the coaxial connector can be enclosed by the side plate, the side walls of the shield case, and the partition wall. Therefore, a shield effect on the core can be enhanced, and an RF signal is not easily influenced by noises.

DESCRIPTION OF EXEMPLARY EMBODIMENTS

Figure 1:
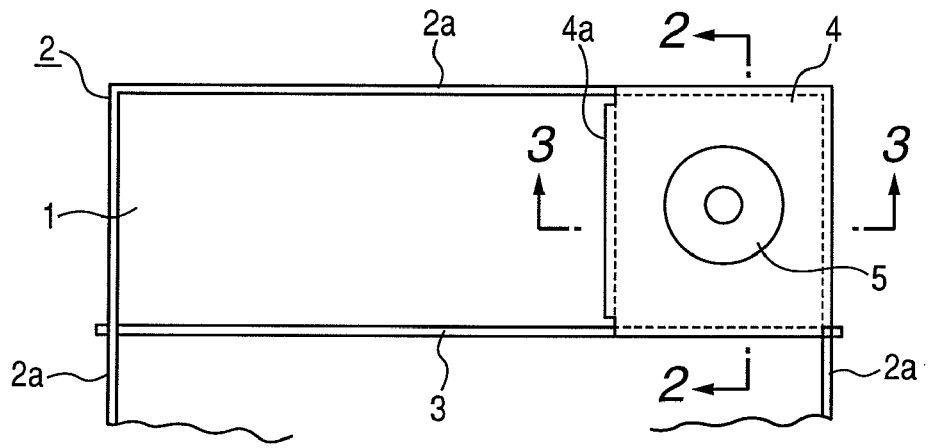
FIG. 1 is a plan view illustrating a main part of a high frequency unit according to a first embodiment of the invention, where a sheet metal cover is omitted.
Figure 2:
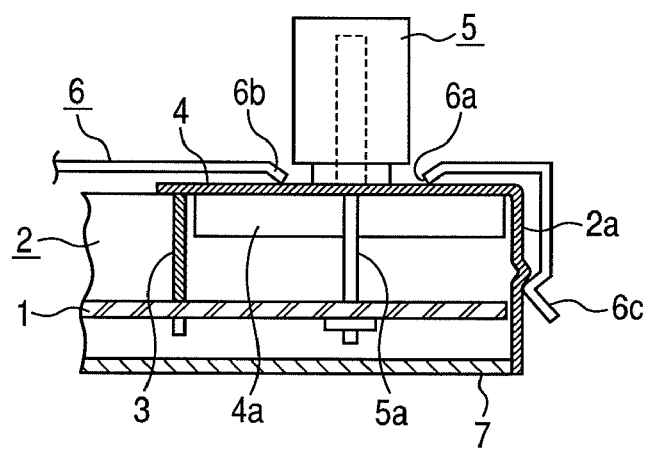
FIG. 2 is a cross-sectional view taken along line 2-2 of FIG. 1.
Figure 3:
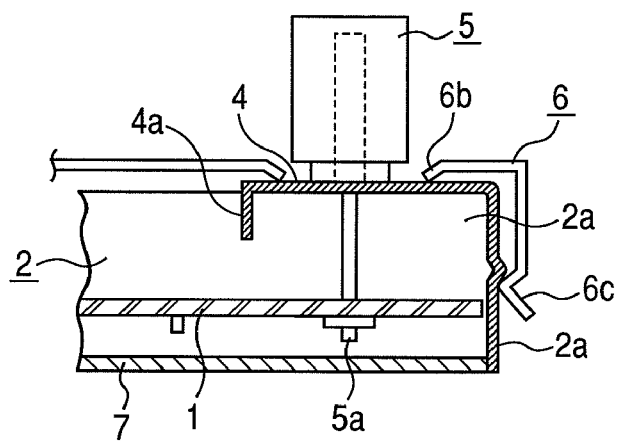
FIG. 3 is a cross-sectional view taken along line 3-3 of FIG. 1.

Exemplary embodiments of the invention will be described with reference to the accompanying drawings. FIG. 1 is a plan view illustrating a main part of a high frequency unit according to a first embodiment of the invention, where a sheet metal cover is omitted. FIG. 2 is a cross-sectional view taken along line 2-2 of FIG. 1. FIG. 3 is a cross-sectional view taken along line 3-3 of FIG. 1.

The high frequency unit illustrated in FIGS. 1 to 3, schematically includes a circuit board 1 on which a high frequency circuit unit such as a tuner circuit is formed, a shield case 2 having a frame shape enclosing the circuit board 1 with four side walls 2a (here, one of the side walls is not shown), a partition wall 3 for partitioning a space on the circuit board 1, a mounting plate 4 which faces the circuit board 1 and of which an outer edge is supported by the side walls 2a or the partition wall 3, a coaxial connector 5 fixed to the mounting plate 4 to protrude outward, a sheet metal cover 6 covering an upper open end of the shield case 2, and a lower cover 7 covering a lower open end of the shield case 2.

The shield case 2, the sheet metal cover 6, and the lower cover 7 are formed by pressing metal sheets, and constitute a housing almost completely covering the circuit board 1. The partition wall 3 is a metal plate fixed to the shield case 2, and a plurality of the partition walls 3 are provided on the circuit board 1.

The mounting plate 4 is a rectangular metal sheet extending from one of the side walls 2a of the shield case 2 along the circuit board 1, and three peripheral portions of the outer edge thereof are supported by the two adjacent side walls 2a and the partition wall 3. In addition, a side plate 4a made of a metal piece bent toward the circuit board 1 extends from the one remaining peripheral portion of the mounting plate 4.

A core 5a of the coaxial connector 5 fixed to the mounting plate 4 extends toward the circuit board 1 to be soldered to a connection land of the high frequency circuit unit. In addition, an external conductor of the coaxial connector 5 is soldered to the mounting plate 4. An external connector not shown is mounted to the coaxial connector 5.

The sheet metal cover 6 is provided with a through-hole 6a through which the coaxial connector 5 penetrates, a jetty portion 6b which extends from a periphery of the through-hole 6a to be bent toward the mounting plate 4, and a plurality of engagement protrusions 6c to be engaged with the side wall 2a of the shield case 2. The engagement protrusion 6c is engaged with the side wall 2a such that the sheet metal cover 6 is fitted to the shield case 2, and the upper open end of the shield case 2 is covered by the sheet metal cover 6 overlapping with the mounting plate 4. In addition, when the sheet metal cover 6 is fitted to the shield case 2 as described above, the jetty portion 6b comes in pressing contact with the mounting plate 4.

In the high frequency unit according to this embodiment, of the outer edge (four sides) of the rectangular mounting plate 4, the remaining peripheral portion which is not supported by the two side walls 2a and the partition wall 3 is provided with the bent side plate 4a, and the side plate 4a functions as a reinforcing rib, so that the coaxial connector 5 can be fixed to the mounting plate 4 which has a relatively smaller area and is hardly deformed. Accordingly, it is possible to effectively suppress deformation of the mounting plate 4 which needs to be concerned when the external connector is attached to or detached from the coaxial connector 5, and reliability of a connection between the core 5a of the coaxial connector 5 and the high frequency circuit unit of the circuit board 1 can be increased. In addition, it is possible to easily form the side plate 4a at the peripheral portion of the mounting plate 4 by pressing, so that there is no concern about an increase in manufacturing costs. Moreover, when the side plate 4a extends from the mounting plate 4 as described above, the core 5a of the coaxial connector 5 can be enclosed by the side plate 4a, the two side walls 2a, and the partition wall 3a. Therefore, a shield effect on the core 5a can be enhanced, and an RF signal is not easily influenced by noises.

In addition, in the high frequency unit according to this embodiment, the jetty portion 6b extends from the periphery of the through-hole 6a of the sheet metal cover 6 covering the upper open end of the shield case 2, and the jetty portion 6b comes in pressing contact with the mounting plate 4. Therefore, a risk that internal high frequency waves and harmonic waves thereof leak through the through-hole 6a and may affect the coaxial connector 5 is small, and mechanical strength of the sheet metal cover 6 can be enhanced due to the jetty portion 6b. In addition, as described above, the mounting plate 4 is hardly deformed, which means that the jetty portion 6b comes in pressing contact with the mounting plate 4 by being taken into the mounting plate 4.

Figure 4:
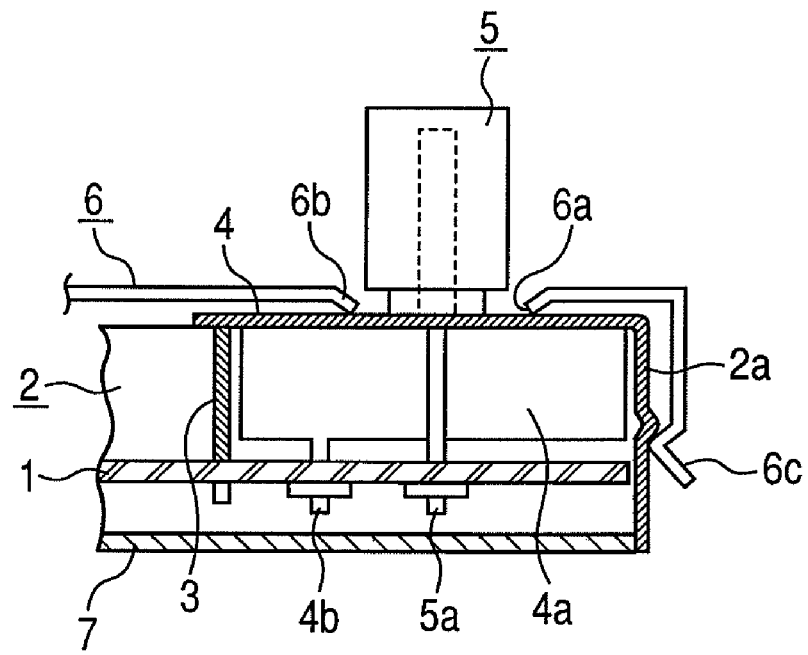
FIG. 4 is a cross-sectional view illustrating a main part of a high frequency unit according to a second embodiment of the invention.

FIG. 4 is a cross-sectional view illustrating a main part of a high frequency unit according to a second embodiment of the invention. Like elements corresponding to FIG. 2 are denoted by like reference numerals, so that a detailed description thereof is omitted.

The second embodiment is significantly different from the above-mentioned first embodiment in that a linear leg portion 4b penetrating the circuit board 1 is provided to the side plate 4a extending from the peripheral portion of the mounting plate 4 to protrude, and the leg portion 4b is soldered to a ground circuit unit formed on a lower surface of the circuit board 1. Accordingly, the side plate 4a is retained by the circuit board 1 with the leg portion 4b interposed therebetween, so that the mounting plate 4 is hardly deformed. In addition, the side plate 4a of the mounting plate 4 is electrically connected to the ground circuit unit with the leg portion 4b of the mounting plate 4 interposed therebetween, and the shield effect on the core 5a can further be increased.

Figure 5:
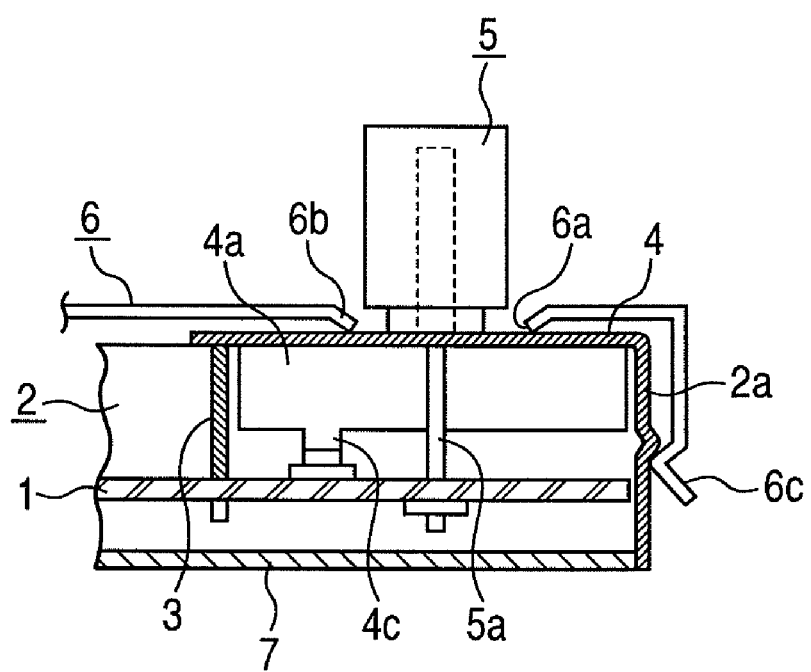
FIG. 5 is a cross-sectional view illustrating a main part of a high frequency unit according to a third embodiment of the invention.

FIG. 5 is a cross-sectional view illustrating a main part of a high frequency unit according to a third embodiment of the invention. Like elements corresponding to FIGS. 2 and 4 are denoted by like reference numerals, so that a detailed description thereof is omitted.

The third embodiment is different from the above-mentioned second embodiment in that an L-shaped leg portion 4c mounted on the circuit board 1 is provided to the side plate 4a extending from the peripheral portion of the mounting plate 4 to protrude, and the leg portion 4c is soldered to the ground circuit unit formed on an upper surface of the circuit board 1. Therefore, in the third embodiment, since the side plate 4a of the mounting plate 4 is retained by the circuit board 1 with the leg portion 4c interposed therebetween, the mounting plate 4 is hardly deformed. In addition, since the side plate 4a is electrically connected to the ground circuit unit with the leg portion 4c interposed therebetween, the shield effect on the core 5a can further be enhanced.

It should be understood by those skilled in the art that various modifications, combinations, sub-combinations and alternations may occur depending on design requirements and other factors insofar as they are within the scope of the appended claims of the equivalents thereof.

What is claimed is:

1. A high frequency unit comprising:
   a shield case having a frame shape enclosing a circuit board with a plurality of side walls;

a partition wall that partitions a space on the circuit board;

a mounting plate made of a metal sheet supported by the partition wall and the side walls of the shield case; and a coaxial connector fixed to the mounting plate to protrude outward, wherein a core of the coaxial connector extending from the coaxial connector toward the circuit board is connected to a high frequency circuit unit of the circuit board, and a side plate extends from a peripheral portion, which is not supported by the side walls of the shield case and the partition wall, of an outer edge of the mounting plate, bent toward the circuit board.

2. The high frequency unit according to claim 1, wherein three peripheral portions of the mounting plate are supported by the two adjacent side walls of the shield case and the partition wall, and the side plate extends from the remaining one peripheral portion of the mounting plate.

3. The high frequency unit according to claim 1, wherein the side plate of the mounting plate has a leg portion, and the leg portion is soldered to a ground circuit unit of the circuit board.

4. The high frequency unit according to claim 2, wherein the side plate of the mounting plate has a leg portion, and the leg portion is soldered to a ground circuit unit of the circuit board.

5. The high frequency unit according to claim 1, further comprising a sheet metal cover which has a through-hole through which the coaxial connector penetrates, and overlaps with the mounting plate to cover an open end of the shield case, wherein the sheet metal cover is provided with a jetty portion extending from a periphery of the through-hole to be bent toward the mounting plate such that the jetty portion comes in pressing contact with the mounting plate.

6. The high frequency unit according to claim 2, further comprising a sheet metal cover which has a through-hole through which the coaxial connector penetrates, and overlaps with the mounting plate to cover an open end of the shield case, wherein the sheet metal cover is provided with a jetty portion extending from a periphery of the through-hole to be bent toward the mounting plate such that the jetty portion comes in pressing contact with the mounting plate.

7. The high frequency unit according to claim 3, further comprising a sheet metal cover which has a through-hole through which the coaxial connector penetrates, and overlaps with the mounting plate to cover an open end of the shield case, wherein the sheet metal cover is provided with a jetty portion extending from a periphery of the through-hole to be bent toward the mounting plate such that the jetty portion comes in pressing contact with the mounting plate.

8. The high frequency unit according to claim 4, further comprising a sheet metal cover which has a through-hole through which the coaxial connector penetrates, and overlaps with the mounting plate to cover an open end of the shield case, wherein the sheet metal cover is provided with a jetty portion extending from a periphery of the through-hole to be bent toward the mounting plate such that the jetty portion comes
in pressing contact with the mounting plate.

* * * * *